United States Patent [19]

Heller et al.

[11] Patent Number: 5,292,558
[45] Date of Patent: Mar. 8, 1994

[54] PROCESS FOR METAL DEPOSITION FOR MICROELECTRONIC INTERCONNECTIONS

[75] Inventors: Adam Heller, Austin, Tex.; Panagiotis Argitis, Piraeus, Greece; Joseph C. Carls, Austin, Tex.

[73] Assignee: University of Texas at Austin, Texas, Austin, Tex.

[21] Appl. No.: 742,391

[22] Filed: Aug. 8, 1991

[51] Int. Cl.$^5$ .................. B05D 5/12; C23C 16/06; H01L 21/314
[52] U.S. Cl. .................................. 427/533; 427/534; 427/96; 427/98; 427/99; 427/123; 427/124; 427/125; 427/250; 427/252; 437/186; 437/187; 437/189; 437/192; 437/195; 437/229; 437/231
[58] Field of Search ............... 437/186, 187, 189, 192, 437/195, 229, 231; 427/533, 534, 250, 252, 123, 124, 125, 96, 98, 99

[56] References Cited

U.S. PATENT DOCUMENTS

| | | | |
|---|---|---|---|
| 4,694,138 | 9/1987 | Oodaira et al. | 219/121 LM |
| 4,843,034 | 6/1989 | Herndon et al. | 437/189 |
| 4,865,873 | 9/1989 | Cole, Jr. et al. | 427/53.1 |
| 4,914,052 | 4/1990 | Kanai | 437/81 |
| 5,026,666 | 6/1991 | Hills et al. | 437/195 |
| 5,087,589 | 2/1992 | Chapman et al. | 437/195 |

OTHER PUBLICATIONS

Hopper, R. T., "How to Apply Noble Metals to Ceramics"; Ceramic Industry, Jun. 1963 (no pp. numbers).
Lee, Pei-Ing et al. "Chemical Vapor Deposition of Tungsten (CVD W) as Submicron Interconnection and Via Stud"; J. Electrochem. Soc., vol. 136, No. 7, Jul. 1989, pp. 2108-2112.
Creighton, "A Mechanism for Selectivity Loss During Tungsten CVD" Jan. 1989, J. Electrochem. Soc. pp. 271-276.
Ting et al. "Selective Electroless Metal Deposition for Via Hole Filling in VLSI Multilevel Interconnection Structures" Feb. 1989, J. Electrochem. Soc. 462-466.
van de Putten et al. "Selective Electroless Ni Depositio On Si for Contact Hole Filling", Oct. 1989, Abstract 467 ECS Fall Meeting.
Flis et al, "Nucleation and Growth of Electroless Nickel Deposits On Molybdenum Activated with Palladium" Jan. 1984, J. Electrochem. Soc. pp. 51-57.
Harada et al, "The Characterization of Via-Filling Technology with Electroless Plating Method" Nov. 1986, J. Electrochem. pp. 2428-2430.
Pai et al. "A Low Temperature Copper Deposition Process for Interconnection Application", Oct. 1989, Abstract 212 ECS Fall Meeting.
Lami et al. "Evaluation of the Selective Tungsten Deposition Process for VLSI Circuit Applications" Apr. 1988, J. Electrochem. Soc. 980-984.

*Primary Examiner*—Shrive Beck
*Assistant Examiner*—Bret Chen
*Attorney, Agent, or Firm*—Irving M. Freedman

[57] ABSTRACT

A method for forming interconnections in microelectronic devices, including interconnections through small vias between different layers in the microelectronic devices include the spin coating of a film comprising a polyoxometalate and an organic material on the substrate. The film is optionally patterned by lithography, the polymer is removed, and the polyoxometalate is reduced to a metal layer. The metal layer may in one embodiment provide a nucleating zone for the deposition of metal.

129 Claims, 3 Drawing Sheets

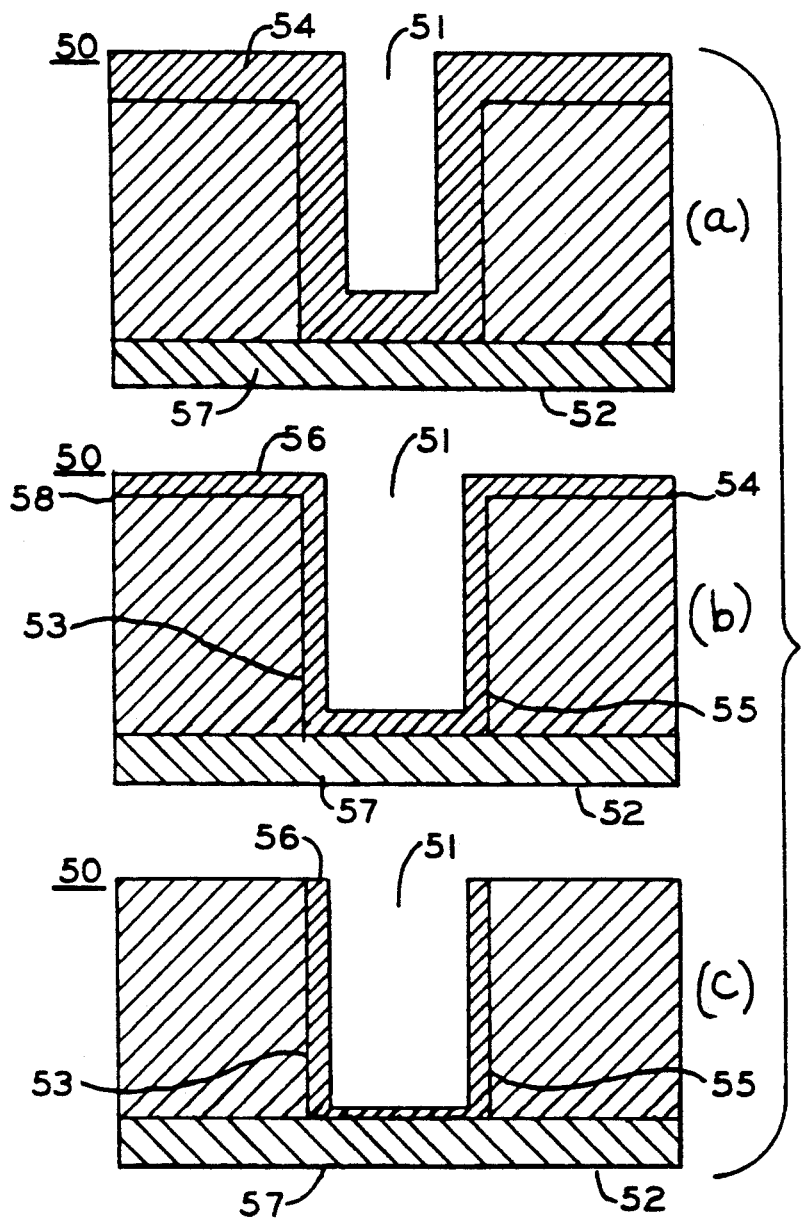
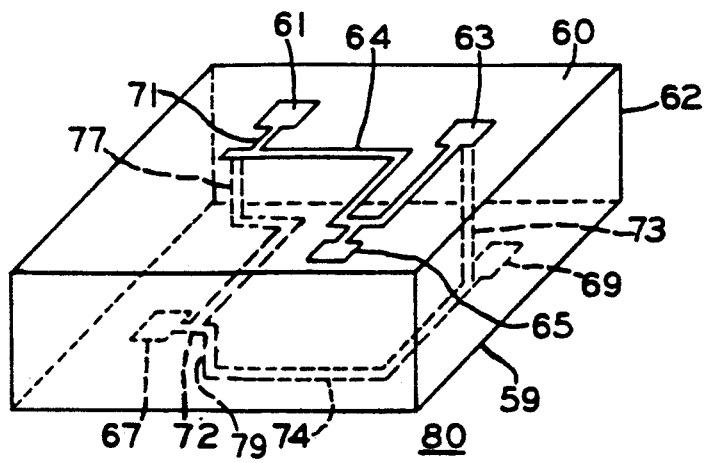
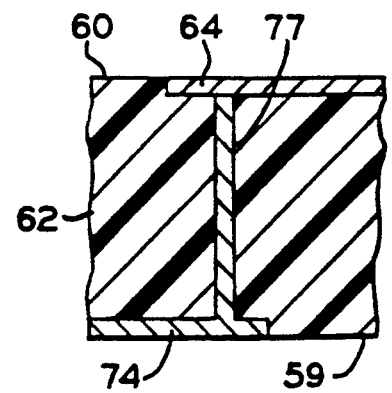

PROCESS FOR METAL DEPOSITION FOR MICROELECTRONIC INTERCONNECTIONS

BACKGROUND OF INVENTION

This invention relates to a metal deposition process for microelectronic integrated-circuit device interconnections. The integrated circuits may have electrical, optical or mixed electrical and optical components. The invention also addresses the problem of providing a conductive filling or wall-coating for electrical connections between various metallic layers in integrated circuits with multiple levels of metallization. In particular it addresses the manufacture of connections between metal layers through vias, i.e. conductor-filled contact holes connecting the layers. When the via walls are near-vertical or actually vertical, the manufacturing is difficult for small and long or deep vias, such as vias of about one micrometer or less in diameter, having aspect ratios greater than 1.0. (The aspect ratio is the vertical distance between the interconnected layers divided by the diameter of the vias.)

For the manufacture of metallized vias and also of lateral inplane conductive interconnections, it is desirable that the interconnection forming process or method utilize readily obtainable materials of long shelf life. These methods and materials must form interconnecting patterns on defined areas of insulating dielectrics such as silicon dioxide, silicon nitride or glasses. In the metallization of vias, conventional processes such as evaporation (e.g. of aluminum) or sputtering (e.g. of a refractory metal like tungsten) do not provide adequate coverage of vertical or near vertical walls. The coverage of steps is also unsatisfactory. Accordingly, considerable effort has been directed at trying to devise improved methods to fill vias with conductive material. It has been recognized that these efforts, if successful, could be an important factor in improving the yield and lowering the cost of ULSI (ultra large scale integrated circuit) devices.

Tungsten is a high-melting refractory metal used in the manufacture of integrated circuit devices when a higher melting point or reduced interdiffusion with silicon are essential. Tungsten also provides a barrier against the interdiffusion of aluminum and silicon, and is usually deposited by chemical vapor deposition or by sputtering. However, neither chemical vapor deposition nor sputtering of tungsten is satisfactory for metallization of vias with steep or vertical walls, particularly when their diameters are small.

It is desirable that the method providing interconnections in VLSI or ULSI devices utilize materials and methods that are compatible with the now existing device manufacturing materials and processes. Thus, it is preferred that films containing polymeric materials be applied by spin coating. In order to avoid defects, such as pinholes in thin spun films, the spun solutions must exhibit superior wetting characteristics and the films formed upon drying must adhere well to the surfaces being coated. The solutions and the resulting films must cover difficult topographies, including walls of vertical vias. It is further desirable that the method of metallization be capable of microlithographically forming micron-size and submicron-size features consistently with existing VLSI device manufacturing processes, and that the interconnecting patterns generated act, when so desired, as sites for further selective deposition of metals such as tungsten, molybdenum, nickel or copper.

Methods to produce metal films for interconnections in devices, including methods based on the use of solutions of organic ligand-bound metal atoms and ions are known. However, the patterning of films formed of these solutions has until now been done by heating of certain film areas but not others. Such selective heating has been shown to lead to decomposition of the soluble complex, i.e. to removal of part or all of the organic ligands, so that a metallic residue was usually left in defined areas. These thermal techniques are suited for the formation of patterned films of noble metals, such as gold, platinum and palladium, because these metals, when heated with elements of the ligand, that often include oxygen, nitrogen or sulfur, in addition to carbon and hydrogen, do not form stable insulating compounds. These methods are, however, not appropriate for the deposition of tungsten and other reactive Group V and Group VI metals and are especially unsuited for their deposition from aqueous solutions. One reason for this is that Group V and Group VI elements form oxides that are stable and difficult to reduce.

Photoresist materials containing metal atoms have also been used in the fabrication of interconnecting components in VLSI devices. Their use makes it possible to reduce the number of steps in the patterning process.

OBJECTS AND SUMMARY OF INVENTION

It is an object of the present invention to provide an improved method of forming interconnections in microelectronic devices.

It is a further object of the present invention to provide an improved interconnection forming method in microelectronic devices that is suitable for connecting various metallization levels through the metallization of vias with steep or even vertical walls.

It is a still further object of the present invention to provide an improved interconnection forming method for microelectronic devices utilizing readily obtainable and stable materials, i.e. materials that are commercial products and that have a long shelf life.

It is another object of the present invention to provide an improved interconnection forming method for microelectronic devices enabling the deposition of tungsten, molybdenum and other reactive Group V and Group VI metals, and their alloys.

It is yet another object of the present invention to provide an improved interconnection forming method for microelectronic devices, where the resulting interconnector exhibits a high melting temperature and provides a barrier against the interdiffusion of metals and dopants into substrates such as silicon.

It is an additional object of the present invention to provide an improved interconnection forming method for microelectronic devices that is compatible with existing microelectronic device manufacturing materials and processes including those for microlithographic patterning, or that is applicable even to difficult topography, or both.

The above and other objects, some of which are made apparent in the following description of the invention, are realized through a process utilizing the spinning of a film containing both a soluble organic constituent and a polyoxometalate; oxidation of the organic constituent in the film to a non-nucleating (non-electrocatalytic) metal oxide; and reduction of the metal oxide to a crystalline or amorphous material on which metal can be selectively and/or catalytically deposited through a commonly used process step such as chemical vapor deposition or electroless deposition. The method in one embodiment utilizes formation of a film through spin coating and drying, followed by its lithographic patterning, a process whereby the film is removed from those areas where nucleation and subsequent deposition of metal are not desired. In an alternate embodiment, anisotropic back-etching such as a plasma fluorine RIE (reactive ion back-etching) without lithographic patterning is used to remove the oxidized or reduced film from horizontal surfaces, including the bottom of vias, but not from via walls. This process leaves a film of the polyoxometalates on the walls that is reducible to a metal layer.

Patterned metallic films can also be formed by an alternative process where a radiation sensitive photoresist is first spun then patterned on the polyoxometalate containing film, after which those areas of the polyoxometalate film that are not resist-covered are removed through a suitable etching process such as fluorine RIE.

BRIEF DESCRIPTION OF DRAWINGS

FIG. 5 is a drawing illustrating an application of the method of FIG. 1 related to that illustrated in FIGS. 4(a)–4(c) but without patterning of the polyoxometalate/organic polymer films.

FIG. 6 is a drawing illustrating the interconnection through vias in multilayer metallized IC devices.

FIG. 7 is an enlarged view illustrating the interconnection provided through a via in accordance with the present invention.

Referring first to FIG. 1. FIG. 1 illustrates the use of the invention for the formation of metallic films. The metallic film is formed on the wafer or base 2, which is often silicon dioxide or silicon nitride on silicon, but which may also be another insulating dielectric such as polyimide or a conductive material such as aluminum or tantalum. A film 4 is spin coated onto the base substrate 2. The film 4 comprises mixtures of one or several polyoxometalates and one or several organic constituents such as a mixture of phosphotungstic acid and polyvinyl alcohol. After suitable patterning of film 4, the pattern formed may be used in the manufacture of interconnections. The film is formed by spinning from a water-based solution, drying, patterning (when such patterning is desired), oxidation in an air or an oxygen furnace where the organic constituent is burned off, and reduction in a hydrogen furnace to metallic tungsten or to a conductive tungsten alloy or to a conductive tungsten compound 6 as shown is FIG. 1(b). To the extent that the tungsten metal containing layer 6 is too thin for a particular application, an additional metal layer 8 may be deposited on the thin metallic layer 6 as shown in FIG. 1(c). The tungsten layer 6 may be activated with a Group VIII or a noble metal such as palladium to enhance the deposition of the metal layer 8, which may be nickel, deposited from an electroless plating solution; tungsten, deposited by chemical vapor deposition; or another metal deposited by either of the above processes or by electroplating.

The film 4 may comprise a mixture of polyvinyl alcohol with a polyoxometalate such as phosphotungstic acid, phosphomolybdic acid, ammonium molybdate or ammonium diphosphotungstate. Polyoxometalate-containing films can also be spun from solutions containing polymers such as polyacrylic acid, polyvinylpyrrolidone, or 2-hydroxyethylmethacrylate.

The oxidation of the polymer in the film consisting of a phosphotungstic acid/polyvinyl alcohol mixture can be carried out in an oxygen-containing plasma or by heating in an oxygen-containing atmosphere. The reduction to tungsten can be carried out by heating in a hydrogen-containing atmosphere or in an atmosphere containing a gas such as ammonia that is a potential source of hydrogen. The reduction can also be carried out in a plasma containing hydrogen or a plasma formed in a gas that decomposes to form hydrogen, such as, for example, ammonia. Prior oxidation of the polymer may not be necessary if the reduction takes place at elevated temperatures, for example, in a hydrogen furnace at 700°, where most organic compounds decompose and many volatilize.

Selective metal deposition on the previously formed metallic whole, or patterned (as described below in connection with FIG. 2), layer 6 can be done in different ways depending on the nature of the pattern. In the case of nucleating tungsten layers, chemical vapor deposition (CVD) of tungsten may be utilized. Electroless deposition of metals such as nickel on the activated surfaces is also a suitable technique; and electroplating is also possible on continuous metallic surfaces.

A variety of metals and metal alloys can be deposited on different substrates through this method. By using polyoxometalates, metals which exhibit characteristics of interest for VLSI devices such as molybdenum, tungsten, alloys with niobium, vanadium, tantalum, and titanium can be deposited. It also appears that pure non-alloyed vanadium, niobium or tantalum may be deposited.

When the material 4 is a radiation sensitive photoresist that comprises a mixture of a polyoxometalate and organic material in the manner described in detail in our copending U.S. patent application Ser. No. 07/384,705 filed on Jul. 21, 1989, now U.S. Pat. No. 5,178,989, a simple way of making metallic micropatterns is also possible. For certain applications the use of micropatterns produced from a photoresist can reduce the number of steps involved in producing VLSI devices, particularly when the formed micropatterns act as interdiffusion barriers (e.g. of silicon and aluminum) and at the same time act also as nucleation sites for the selective deposition of metals such as Al or Cu.

Figure 1:
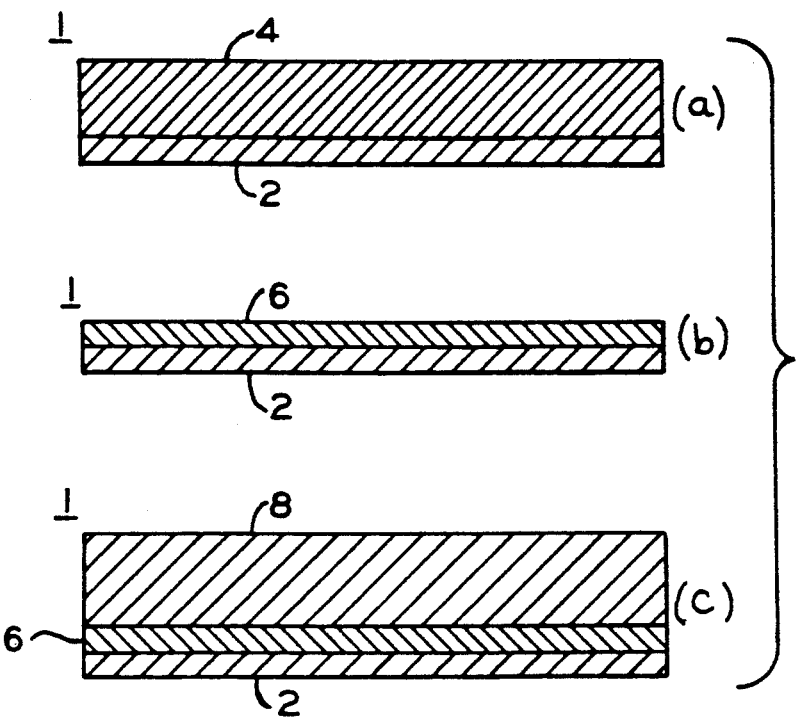
FIG. 1 is a drawing illustrating one embodiment of the invention.

Referring next to FIGS. 2(a) through 2(d), the film 14 is now a polyoxometalate containing photoresist film that can be patterned into the desired metallic interconnections between circuit elements. Elements of the interconnecting pattern are shown as 14a, 14b and 14c see FIG. 2(b)). The polyoxometalate containing resist is first lithographically patterned, for example through photolithography. The patterned resist is then processed in the manner described above in connection with FIG. 1, the photoresist segments 14a, 14b and 14c being processed to metal, such as tungsten, by oxidation or decomposition of their organic component and their reduction to metallic tungsten segments 16a, 16b and 16c (see FIG. 2(c)). A metal such as tungsten may then be selectively deposited on the segments 16a, 16b and 16c by chemical vapor deposition to form a thicker, more conductive pattern with segments 18a, 18b and 18c; or a metal such as nickel may be selectively deposited by electroless plating to again form more conductive, thicker segments 18a, 18b and 18c over the tungsten segments 16a, 16b and 16c as shown in FIG. 2(d).

Figure 2:
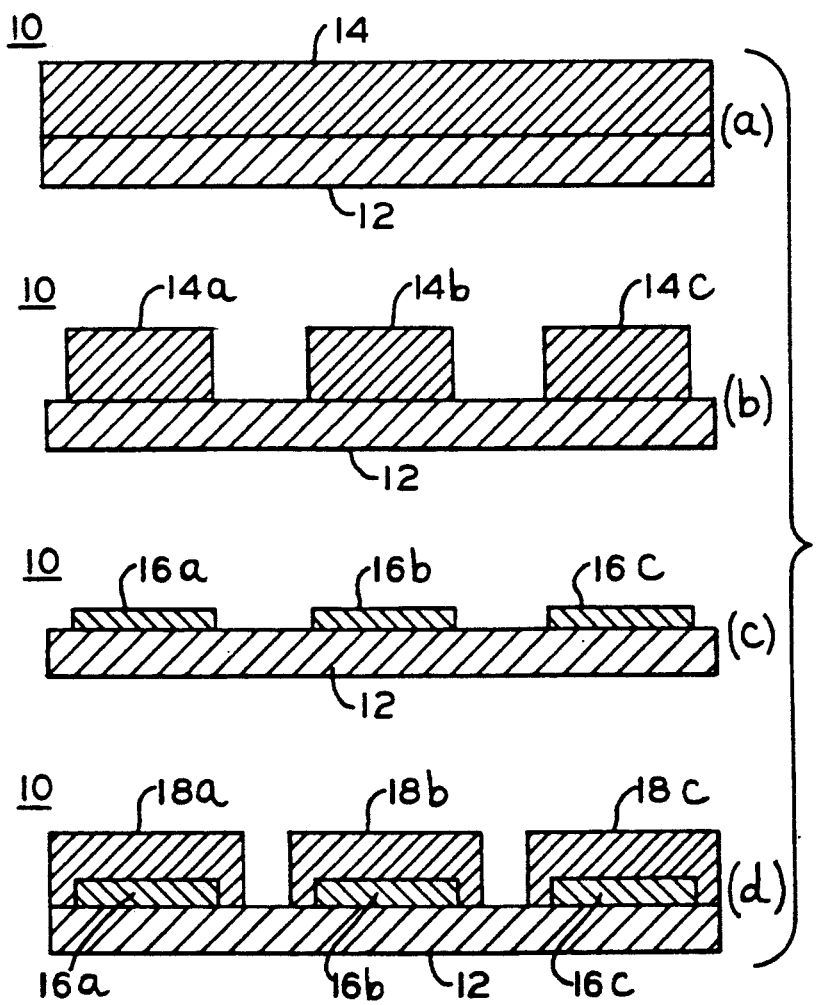
FIG. 2 is a drawing illustrating applications of the method of FIG. 1, when the polyoxometalate/organic constituent is a photoresist.
Figure 3:
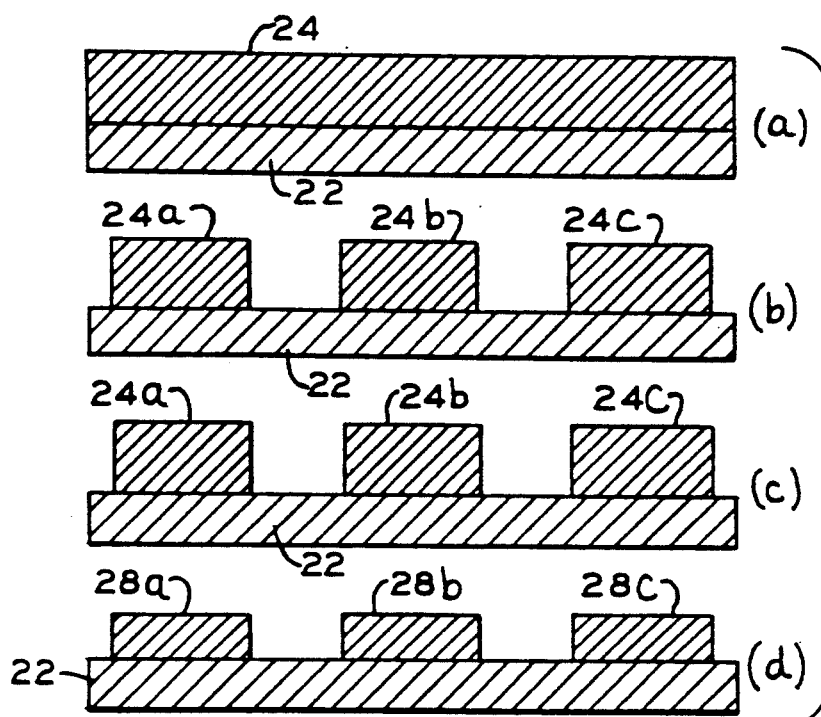
FIG. 3 is a drawing illustrating a modification of the method of FIG. 2 providing substantially thicker metallic interconnections.

FIGS. 3(a) through 3(d) illustrate a modification of the method of FIG. 2. Referring to FIG. 3, a polyoxometalate containing photoresist film 24 is first spin coated on the substrate 22 as shown in FIG. 3(a). The resist 24 is then patterned by lithography to provide connector resist segments such as 24a, 24b and 24c (see FIG. 3(b)) through removal of the intervening portions of resist 24 in the same manner as in FIGS. 2(a) and 2(b). However, in the embodiment of FIG. 3, the structure is then treated with a solution of a polyoxometalate so as to increase the polyoxometalate content of resist segments 24a, 24b and 24c. The organic part of segments 24a, 24b and 24c is then removed by oxidation or decomposition and the residual metal (e.g. tungsten) containing oxide segments are reduced to metal (e.g. tungsten) segments (see FIG. 3(d)) as described above in connection with FIG. 1.

Via hole filling for interconnectors is of importance in integrated circuit (IC) manufacture where interconnections between multiple layers or levels of metal become necessary when the density of devices on the IC chips is very high. In forming multilevel interconnections, the metallization of small via holes that interconnect circuitry at different levels is a critical and difficult process step. Selective chemical vapor deposition of tungsten, copper or aluminum, and electroless deposition of metals such as nickel or cobalt are favored for metallizing these holes. Such processes are not satisfactory for use on vertical walls, leading to the use and/or necessity of walls which are sloped or beveled. The slope allows or facilitates their metallization by evaporation, sputtering or by chemical vapor deposition. However, when the walls are vertical or close to vertical, the growth is from the bottom of a well upward, rather than from the walls inward. As used herein "vertical" means substantially vertical or perpendicular to the planes of the microelectronic device on which the majority of the electronic components and/or circuits are positioned. When the metal forms from the bottom of a well or via up, the frequency of incompletely filled wells or vias is excessive. This leads to low yields of operating devices, and also to poor reliability of operating devices.

The present invention provides a continuous, dependable, metallic interconnection over the walls of via holes, including those of small diameter. Also, it is particularly useful in overcoming via-metallization problems encountered in multilayer interconnections.

Figure 4:
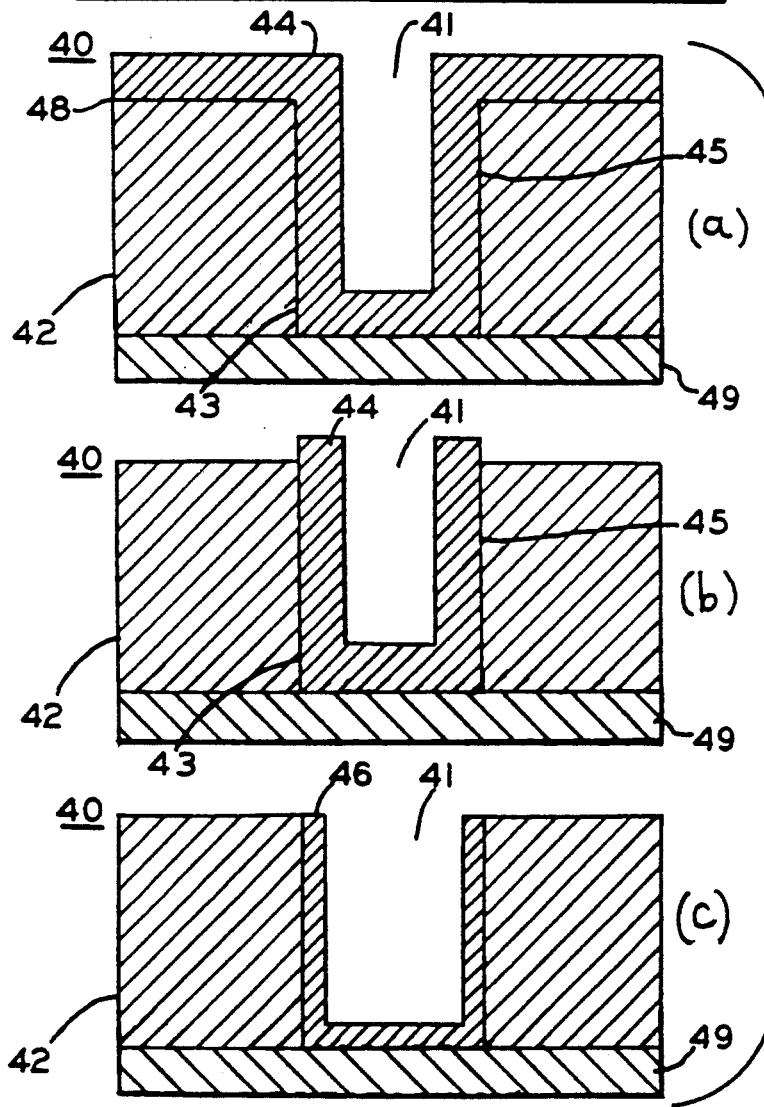
FIG. 4 is a drawing illustrating an application of the method of FIG. 2 for the metallization on a via wall and the bottom of a well-hole.

FIGS. 4(a) through 4(c) show a via well-hole 41 in substrate 42 and including vertical walls 43 and 45 extending through a portion of the substrate and reaching the bottom conductor 49. As shown in FIG. 4(a), a polyoxometalate photoresist film 44 is spin coated onto the substrate 42 covering not only surface 48 of the substrate 42 but also the walls 43 and 45 of via 41 and the bottom conductor 49 of the via remote from the surface 48. Lithographic patterning is then utilized to remove the photoresist film 44 from surface 48, leaving the coating on the bottom conductor 49 and walls 43 and 45 of the via as shown in FIG. 4(b). The structure 40 is then oxidized as described above in connection with FIG. 1 and reduced to the metal, such as tungsten, 46 as shown in FIG. 4(c). Selective deposition of metal such as tungsten or nickel in order to make the via sufficiently conductive may then be accomplished by conventional chemical vapor deposition or electroless deposition as described above in connection with FIGS. 1-3.

An alternate process, in providing metallic interconnections through vias that does not require a lithographic step, is shown in FIG. 5. In this embodiment, the entire wafer or substrate surface of substrate 52 is coated with the film 54, but unlike in FIG. 4, it is not patterned, as shown in FIG. 5(a). The continuous film is oxidized, then reduced to tungsten, forming a continuous metallic layer 56 as shown in FIG. 5(b). This layer covers not only the surface 58 of the substrate 52, but also the metal at the via hole bottom 57 and the vertical walls 53 and 55 of the via. The metallic layer 56 is removed from the top or horizontal surface 58 of the substrate 52 by anisotropic back etching, but such etching does not remove most of the metal from the side walls 53 and 55 of the via 51. The anisotropic back etching also removes some of the metal that coats the horizontal bottom surface 57 of via 51 (as shown in FIG. 5(c)). If the thickness of the metallic layer 56 is greater at the bottom surface 57 of via 51 than on the surface 58 of substrate 52, tungsten may remain at the bottom after the back etching. One suitable method of back etching is the use of plasma RIE with high anisotropy. The application of the process described above in connection with FIGS. 4 and 5 in the provision of interconnections through vias in multilayer metallized IC devices is shown in FIGS. 6 and 7.

Referring first to FIG. 6, the substrate 62 includes conducting elements such as 61, 63 and 65 on the upper level 60 and a plurality of other conducting elements such as 67 on an intermediate level and a plurality of conducting elements such as 69 in the lowest metallization level 59. The patterned interconnectors 64 and 71 interconnect the elements 61, 63 and 65 on the upper level 60, while interconnectors such as 72 and 74 interconnect the elements 67 and 69 on the intermediate and lower levels, respectively, of the IC device, part of which is shown as 80. Vias or holes such as 73, 77 and 79 extend vertically or perpendicular to levels such as 59 and 60 through the substrate 62 to provide interconnections between the circuitry on the three levels. As IC devices become more complex, with more circuit elements and circuit functions crowded onto a limited area, the horizontal area occupied by the vertical interconnectors and, in particular, the cross sectional area of interconnectors such as 73 and 77 become of increasing concern. In order to increase the area available for other circuit elements, it is important that the area or diameter of vias, such as 73 and 77, be as small as possible. This is best achieved when the vias have vertical and parallel sides even though it is easier to provide interconnectors on or through vias with sloping side walls. For example, a funnel-shaped via, or a via having a wider diameter at the top surface 60 than at the bottom surface 59, and particularly a via with a relatively large diameter, might be coated with an interconnector through metal evaporation or metal sputtering. However, the larger opening at one of the levels such as the upper level 60 requires the use of a larger area of the upper plane than would a cylindrical small diameter via, that is one with vertical walls.

FIG. 7 is an enlarged view illustrating in somewhat greater detail the interconnection provided through a via in accordance with the present invention. As shown in FIG. 7, the interconnector 64 on the upper surface 60 of the VLSI device 80 connects to the interconnector 74 on the lower surface 59. The application of a conductive interconnector through the via 77 in accordance with the present invention provides the interconnection between the connectors 64 and 74, and hence between circuit elements such as 61, 63 and 65 on the upper surface 60 and circuit elements such as 67 and 69 and the lower surface 59.

It is to be noted that in the process of this invention the materials used, and the kinds of metals that can be applied in films, are compatible with existing known microelectronic processing techniques and are useful for interconnecting circuit elements.

The basic components of the materials used for the films 4, 14, 24, 44 and 54 of FIGS. 1, 2, 3, 4 and 5, respectively, are polyoxometalates and organic constituents. The polyoxometalates form a distinctive class of inorganic compounds formed by five metals of the periodic table, molybdenum (Mo), tungsten (W), and to a lesser extent vanadium (V), Niobium (Nb) and tantalum (Ta). These compounds are soluble metal oxides that are composed of polyhedra, primarily octahedra, having the above mentioned metals in a high oxidation state in their center and oxide anions ($O^{2-}$) in their corners. Other metallic elements like chromium (Cr) or manganese (Mn) form simple oxometalates but they do not form as stable polymeric structures. Chromium, for example, is known to form common oxometalates with up to two metal atoms, whereas higher chromates (with up to 3 or 4 metal atoms) are few. The general formulas of suitable polyoxometalates can be expressed as $M_m M'_n O_z^{x-}$ (isopoly oxometalates) or $A_a M_m M'_n O_z^{x-}$ (heteropoly oxometalates) where M=Mo, W, V, Nb, or Ta; m=5-36 (for the common structures); M'=the metals mentioned for M; $0 \leq n \leq m$; A (called heteroatom)=practically any element; a<m; O=oxygen; and z>m. Examples of polyoxometalates which have been used include heteropoly oxometalates of the general formulas $AM_{12}O_{40}^{x-}$ and $A_2M_{18}O_{62}^{x-}$ and isopoly oxometalates. Specifically the compounds phosphotungstic acid ($H_3PW_{12}O_{40}$), phosphomolybdic acid ($H_3PMo_{12}O_{40}$), silicotungstic acid ($H_4SiW_{12}O_{40}$), ammonium diphosphotungstate (($NH_4)_6P_2W_{18}O_{62}$) and ammonium molybdate (($NH_4)_6Mo_7O_{24}$) have been found to form good films when spun from solutions also containing organic polymers such as polyvinyl alcohol and polyacrylic acid. Photosensitive compositions of the four heteropoly oxometalates with polyvinyl alcohol that act as photoresists have also been obtained. The phosphotungstic acid is probably the most studied polyoxometalate compound, is commercially and readily available, and has been used in the formation of metallic films through oxidation and reduction of the spun films as set forth in the specific examples of the practice of the invention as described below. Isopoly oxometalates or other heteropoly oxometalates with heteroatoms that also form volatile compounds with O or H may be used if the contamination of the formed metallic films with the heteroatom must be avoided. In general the polyoxometalates should be selected to contain the metal elements that are desired in the formed films. Derivatives of polyoxometalates where some of the metal atoms have been replaced by others, such as Ti or Mn, are known, and may be used. Other derivatives containing organic moieties, have been also synthesized.

Polyoxometalates can be used in solid form as acids or salts, and can be dissolved in water and polar organic solvents, with their solubility being affected by their counterions. Acids may be preferred in this application because acids are typically more soluble in water and other solvents, and they do not introduce additional elements in the film.

The following specific examples are given to more fully illustrate the invention.

EXAMPLE 1

A solution was made containing 6.1% w/v (Weight volume) 100% hydrolyzed poly(vinyl alcohol) of 14,000 nominal molecular weight and 14.4% w/v phosphotungstic acid according to the following procedure: 6.1 grams (gr) of 100% hydrolyzed poly(vinyl alcohol) of 14,000 nominal molecular weight was added to about 80 milliliters (ml) of water and the formed slurry was heated slowly to reach a temperature in the range of 80° C. to 85° C. in approximately 30 minutes and was maintained at this temperature range for approximately 15 minutes until the polymer was dissolved. The solution was then allowed to cool, and water was then added to increase the volume to 100 ml. 14.4 gr of phosphotungstic acid were dissolved in this solution while stirring. The formed new solution was called "PVA 6.1%/phosphotungstic acid solution" and stored and used under light of $\lambda \geq 400$ nm (greater than or equal to a wavelength of 400 nanometers). An oxidized silicon wafer was spin coated with the PVA 6.1%/phosphotungstic acid solution resist at 4,000 revolutions per minute (rpm). A film of approximately 1900 angstroms (Å) thickness was formed. The coated wafer was oxidized in an air furnace at 400° C. for two hours. The film thickness dropped to approximately 1100 Å. The oxidized wafer was then reduced in a hydrogen furnace (at a 150 sccm hydrogen flow rate, reactor volume =550 cm$^3$) at 700° C. for 1 hour. The film thickness dropped to approximately 400 Å. The resistance of the film was measured with a four point probe and the calculated resistivity was $5 \times 10^{-4}$ ohms per centimeter (cm). X-ray diffraction patterns when take shared the characteristic peaks of tungsten metal and those of the substrate.

EXAMPLE 2

An oxidized silicon wafer was spin coated with PVA 6.1%/phosphotungstic acid solution (of Example 1) at 4,000 revolutions per minute (rpm). A film of approximately 1900 Å was formed.

The film was then exposed imagewise to radiation by vacuum contact lithography using broad band DUV (deep ultraviolet) light from a high pressure mercury arc lamp with maximum intensity at about 254 nm. In this instance a pattern mask, containing features as small as 2 μm (microns), was placed in contact with the resist coated wafer. The DUV light, passing through the light transmitting features of the pattern on the mask, exposed portions of the resist. The exposure dose was 180 mJ cm$^{-2}$ (millijoules per square centimeter).

After exposure the film was baked for 5 minutes on a metal surface in an oven of 85° C. and then developed and rinsed as follows: the baked wafer was placed on a spinner and a puddle of developer (which was an aqueous solution containing 2M phosphoric acid, 0.05M phosphotungstic acid and $5\times 10^{-3}$M of a surfactant (sodium dodecyl benzene sulfonate)) was deposited on the wafer surface. The puddle was allowed to remain for 2 minutes, then the wafer was spun at 500 rpm while a stream of fresh developer was sprayed on the surface. After 30 seconds of spray developing, the developer stream was replaced with a rinser stream consisting of a 3 molar aqueous solution of HCl. After spray rinsing for 30 seconds, the spinning wafer was dried in a stream of filtered air. In the developing step the resist was removed from the unexposed areas, and a negative tone resist pattern, which resolved the smallest features present in the exposure mask, was obtained.

The wafer with the patterned resist was then oxidized and reduced the same way as described in Example 1 for the unpatterned wafer. The reduced patterns were imaged by a scanning electron microscope (SEM) and photographed. No gold coating was necessary to avoid charging by the electron beam and thus properly resolve these reduced patterns (as required for the patterns obtained just after development), indicating that the reduced patterns were sufficiently conducting to dissipate any charging by the electron beam. The SEM photos showed that the pattern was preserved after the oxidation and reduction steps, but the thickness of the pattern was reduced as expected.

EXAMPLE 3

A quartz microscope slide was spin coated with PVA 6.1%/phosphotungstic acid solution resist as in Example 1. The same procedure as in Example 2 was then followed except that no pattern mask was used during exposure. Instead, half of the microscope slide was covered with a non-transparent sheet of aluminum which acted as a primitive mask, such that the covered part of the film was dissolved during development.

The ultraviolet (UV) spectrum of the remaining film was then taken and the concentration of the phosphotungstic acid in the film was calculated from its known absorption coefficient at 267 nm. The microscope slide was then immersed in a solution containing 2M HCl and 0.1 M phosphotungstic acid for 2 minutes and rinsed with HCl 6M. The UV spectrum of the film was again taken and it was calculated that the concentration of the phosphotungstic acid in the film had been increased by 70%.

The film was then oxidized and reduced as in Example 1. The final film thickness was approximately 650 Å.

EXAMPLE 4

The same procedure as in Example 2 was followed but a mask with a fine pattern was not used during exposure. Instead, half of the wafer was covered with a (non-transparent) sheet of aluminum acting as a primitive mask and so the covered part of the film was dissolved during development. The wafer with the remaining half of the film was then reduced as in the Example 1 but without previous oxidation.

The wafer was then placed in an electroless Ni plating bath made from one part of Sel-Rex Lectroless ® Ni and two parts of water at 85° C. for 2 minutes, rinsed with water, placed in a Pd activation aqueous solution containing 0.2 g $PdCl_2$/1000 ml and 1 ml cHCl/1000 ml for 1 minute and again in the electroless solution for 2 minutes. Ni was plated selectively on the reduced film. The thickness of the plated film was 1600 Å. The sheet resistance of the film measured with a four point probe was 11.78 ohm per square.

EXAMPLE 5

The procedure of the Example 4 was followed but a fine pattern mask was used during exposure as in Example 2 and a pattern was formed after development.

Ni was plated selectively on the reduced pattern following the same procedure as in Example 4.

EXAMPLE 6

Reduced tungsten micropatterns were formed as in Example 2. The wafer piece with the tungsten pattern was then immersed for 2 minutes in an aqueous Pd electroless solution at 49° C. The solution, which was not stirred during the deposition, had the following composition: 4 g/l (grams per liter) $PdCl_2$, 400 ml c.NaOH, 10 g/l $NH_4Cl$ and 5 g/l $NaH_2PO_2$.

Pd was selectively plated on the tungsten pattern. The calculated rate of plating was 400 Å per minute.

EXAMPLE 7

An oxidized silicon wafer was spin coated with PVA 6.1%/phosphotungstic acid solution, exposed, baked, developed and oxidized as in Example 4. A piece of the wafer was then placed in a hydrogen furnace as in Example 1, however at 450° C. for 2 hours.

The film thickness after this treatment was approximately 400 Å. The resistance of the film was measured with a four point probe and the calculated resistivity was $1\times 10^{-3}$ ohm cm. The film did not exhibit a readily observable X-ray diffraction pattern (except for that of the substrate).

The wafer piece was then electroless plated as in Example 6. Pd was selectively plated on the reduced film.

EXAMPLE 8

An oxidized silicon wafer was spin coated with PVA 6.1%/phosphotungstic acid resist, exposed, baked, developed and oxidized as in Example 4. A piece of the wafer containing part of the remaining film was then placed in a RIE reactor under the following conditions for 1 hour:

Hydrogen flow rate: 400 sccm
Pressure: 230 mTorr
Power: 350 Watts
DC Bias: 370 Volts, approximately The residual thickness of the film after treatment was approximately 200 Å. Its resistance was measured with a four point probe. The calculated resistivity of the film was $2\times 10^{-3}$ ohm cm. The film did not exhibit a readily observable diffraction pattern (except for that of the substrate).

This wafer piece was then electroless plated as in Example 4. Ni was selectively plated on the reduced, conducting, film.

EXAMPLE 9

An oxidized silicon wafer in which holes of 1 μm diameter had been formed was spin coated with PVA 6.1%/phosphotungstic acid solution of Example 1 at 4,000 rpm. The wafer was then oxidized and reduced as in the Example 1.

The wafer was then observed under a scanning electron microscope (SEM) without gold coating. Photos of hole cross sections were taken showing that a metallic tungsten film completely covering the walls of the holes had been formed.

EXAMPLE 10

A silicon wafer covered with different layers of materials was used. These layers were patterned just below the top layer. One layer included aluminum. The top layer was an insulating dielectric layer through which holes of 1 μm diameter had been made. This wafer was spin coated with the solution of Example 1, then oxidized as described in Example 1. A piece of the wafer was then placed in an RIE reactor under the following conditions for 1 hour:

Hydrogen flow rate: 200 sccm
Pressure: 125 mTorr
Power: 350 Watts
DC Bias: 500 Volts, approximately The wafer was then imaged under the SEM as in Example 9. The photos showed that a metallic film completely covering the walls of the holes had been formed.

Other water soluble organic constituents that were used in the formation of patterned polyoxometalate/organic constituent films included polyacrylic acid and polyvinyl pyrrolidone, with polyacrylic acid providing better results when the solutions had a high ionic strength. Poly (2-hydroxy ethyl methacrylate) dissolved in ethoxyethanol was also used. This polymer yielded a positive tone photoresist as explained in our aforementioned copending U.S. patent application Ser. No. 07/384,705.

The use of the materials described in the above embodiments offers several advantages. The first advantage is that the materials are rich in tungsten and molybdenum. Tungsten is a refractory metal of recognized advantage in the manufacture of microelectronic devices, whereas molybdenum also has some advantages, being a better conductor than tungsten and adhering better to certain substrates. The metal ratios can be controlled and defined by using compounds such as $P_2Mo_3W_{15}O_{62}^{6-}$, of which an alloy of molybdenum and tungsten is formed.

Tungsten and molybdenum containing polyoxometalates are soluble in water and in a range of organic solvents. Dissolved tungsten and molybdenum containing polyoxometalates, when mixed with polymers, especially polymers containing polar groups, formed good films which did not crystallize upon evaporation of the solvent. The metal content of films containing polyoxometalates and organic polymers can be high, even though the ionic strength of the solution is moderate. As a result, phase separation of organics, such as polyvinyl alcohol, a constituent that phase separates at high ionic strength, can be avoided.

Yet another advantage is that the oxides of particular interest, namely those of molybdenum and tungsten, are so finely dispersed in the films that they are relatively easily reduced by hydrogen gas to the metal. Temperatures much lower than 700° C. are adequate for the reduction of the tungstate residue to tungsten metal, such that the process is in the useful temperature range for the manufacture of microelectronic devices. Reduction of molybdates to molybdenum occurs at similar, or even lower, temperatures.

The use of simple oxometalates, that is, those with one or two metal atoms, is generally not preferred, because they crystallize more easily during film formation and are not as miscible with the organic constituents, e.g. polymers. Nevertheless, they may be advantageously used in specific applications requiring their presence.

A still further advantage is that the polymers used provide good film forming and surface wetting properties. Polymers with hydrophilic groups that interact well with both the polyoxometalates and with hydrophilic substrates commonly encountered in stages of microelectronic device manufacture (such as silicon dioxide, silicon nitride and silicate glasses) are especially useful. The polymers can also be selected to be easily oxidized by heating in air, or decomposing in air or in an inert atmosphere, without leaving carbonaceous residues since the presence of a polytungstate or other polyoxometalate in the film may catalyze polymer degradation or oxidation.

Water is a preferred solvent in the subject process. The preferred polymers are water soluble and non-toxic. A related advantage of this invention is that the materials used have excellent wetting characteristics towards hydrophilic substrates of interest such as silicon dioxide and silicon nitride. As a result the spun films coat difficult topographies, including vertical or substantially vertical via walls. Polyvinyl alcohol, a preferred organic constituent of the films, has good film forming properties, and is miscible with polyoxometalates.

The above examples and testing establish the usefulness of the invention in forming metallic connections in via holes, providing a method for covering walls of small vias (as small as 1 μm and smaller) with metals, as well as a method for metallic film formation on a variety of materials relevant to the microelectronics industry.

There are yet additional advantages provided by the subject invention. As described above, and as is also evident from copending application Ser. No. 07/384,705, the materials used in the process are capable of forming submicron metallic features microlithographically. The polyoxometalate, although not covalently bound to the polymer, remains in the film following developing. Treatment of the developed photoresist with acidic polyoxometalate solutions as discussed above in relation with FIGS. 3(a)-3(d) can further increase the metal content of the film. Especially important, such patterning in this process can form features as small as 0.3 microns. This capability can be useful in forming microlithographic masks or interdiffusion barriers over the smaller dimension elements in an IC such as gates in MOS devices.

Another advantage of this invention is that the metallic films formed, whether or not patterned, act as nucleation sites for selective metal deposition. The preferred metals (and their partially reduced oxides) of primary interest and useful in the process are tungsten and molybdenum, their alloys and compounds. Tungsten micropatterns formed on silicon substrates can be selectively activated with palladium and plated with electroless nickel and palladium. Tungsten micropatterns formed on aluminum can also be selectively plated with electroless palladium. Methods for electroless metal deposition on tungsten without previous activation with palladium are known and can be used. Tungsten forms nucleation sites on a surface for the selective tungsten chemical vapor deposition (CVD), and the formation of tungsten nuclei on via hole walls in accordance with the present invention is an effective activation process for further metallization of the via by tungsten CVD. The patterned metallic film is activated and prepared for plating by depositing onto its surface an element selected from group VIII of the periodic table. Palladium is suitable as activation for electroless plating.

Significantly, the metallic tungsten that is formed from the film is useful as a nucleating agent for subsequent selective deposition of metals on difficult topographies, such as vertical via walls. The films formed of the spun solutions contain, in addition to the polyoxometalate, an organic constituent, such as polyvinyl alcohol. The improved wetting and film forming characteristics obtained when both the polyoxometalate and the polymer are co-dissolved, enable the formation of adherent films on via walls. Upon oxidation of the organic polymer, followed by reduction of the residual metal oxide, a nucleating film that catalyzes the subsequent deposition of metals remains on the via walls. The selective growth of metal films on nucleating walls reduces the likelihood of discontinuity in the vertical conducting path such as those encountered in a process utilizing growth of metal from the bottom upward in small vertical wells. In addition, it allows non-sloped wall vias of smaller cross section.

In partial summary, metals that are made of the films and other materials used in the novel process are compatible with existing microelectronic materials and processing techniques. The film forming solutions wet substrates of interest, such as silicon, silicon nitride, silicon dioxide, aluminum oxide and other hydrophilic surfaces. Also of importance is the fact that the process allows the formation of metallic films on difficult topographies, including vertical via walls. In addition, patterned metal layers can be made microlithographically. The metallic films formed, whether or not patterned, act as nucleation sites for selective metal deposition. These characteristics can be advantageously used in the fabrication of ICs, including complex and crowded VLSI devices.

While the present invention has been described with respect to certain preferred embodiments thereof, it is to be understood that variations in the details of construction, arrangement and combination of parts, and materials used may be made without departing from its spirit and scope.

What we claim is:

1. A method of selectively forming interconnections in a microelectronic device comprising:
   spin coating on a surface of said microelectronic device a solution containing a polyoxometalate and an organic constituent, the polyoxometalate containing at least one element selected from the group consisting of tungsten, molybdenum, vanadium, niobium, and tantalum to provide a film;
   said polyoxometalate being soluble in water and polar organic solvents and including said one element in a high oxidation state;
   substantially removing the organic constituent of said film; and
   reducing the film from which the organic constituent has been substantially removed to a metallic layer.

2. The method of claim 1 wherein at least some of said organic constituent is removed by heating at a temperature in the range of approximately 250° C. to 700° C.

3. The method of claim 2 wherein said heating is in an oxygen-containing atmosphere.

4. The method of claim 1 wherein said reducing is carried out by heating in a hydrogen-containing atmosphere at a temperature in the range of 300° to 1100° C.

5. The method of claim 1 wherein said reducing is carried out by heating in an atmosphere containing a hydrogen precursor which upon heating decomposes to form a hydrogen-containing mixture.

6. The method of claim 1 wherein said reducing is carried out in a hydrogen-containing plasma.

7. The method of claim 1 wherein the solution which is spin coated includes water.

8. The method of claim 1 wherein the resulting metallic layer forms a conducting interdiffusion barrier, reducing the rate of interdiffusion above and below the barrier.

9. The method of claim 1 including the additional step of depositing a metal on said metallic layer.

10. The method of claim 1 including the additional step of exposing the film to a solution containing a polyoxometalate in acid prior to removing at least some of the organic constituent to increase the polyoxometalate content of the film.

11. The method of claim 10 wherein said solution includes phosphotungstic acid.

12. The method of claim 9 wherein said reducing is carried out by heating in a hydrogen-containing atmosphere at a temperature in the range of approximately 300° C. to 1100° C.

13. The method of claim 9 wherein said reducing is carried out by heating in a furnace in an atmosphere containing a hydrogen precursor which upon heating decomposes to form a hydrogen-containing mixture.

14. The method of claim 9 wherein said reducing is carried out in a hydrogen-containing plasma.

15. The method of claim 9 wherein said solution which is spin coated includes water.

16. The method of claim 9 wherein the resulting metallic layer forms a conducting interdiffusion barrier, reducing the rate of interdiffusion above and below the barrier.

17. The method of claim 9 including the additional step of activating the metallic layer formed by reducing using palladium for said activating.

18. The method of claim 9 wherein the metal which is deposited is selectively deposited by chemical vapor deposition.

19. The method of claim 17 wherein the metal which is deposited on said metallic layer is selected from the group consisting of tungsten, molybdenum, copper, and aluminum.

20. The method of claim 9 wherein the metal which is deposited is selectively deposited by electroless plating.

21. The method of claim 20 wherein the metal which is selectively deposited is selected from the group consisting of nickel, palladium, and copper.

22. A method of selectively forming interconnections in a microelectronic device comprising:
   spin-coating on a surface of said microelectric device a solution containing a polyoxometalate and an organic constituent, the polyoxometalate containing at least one element selected from the group consisting of tungsten, molybdenum, vanadium, niobium, and tantalum to provide a radiation sensitive resist film;
   said polyoxometalate being soluble in water and polar organic solvents and including said one element in a high oxidation state;
   lithographically patterning selected regions of said film to remove said film in said selected regions;
   substantially removing said organic constituent of the lithographically patterned film;

reducing said lithographically patterned film from which said organic constituent has been removed to a patterned metallic layer; and selectively depositing a metal on said patterned metallic layer.

23. The method of claim 22 including the additional step of exposing the film to a solution containing a polyoxometalate in acid prior to removing at least some of the organic constituent to increase the polyoxometalate content of the film.

24. The method of claim 23 wherein said solution includes phosphotungstic acid.

25. The method of claim 22 wherein at least some of the organic constituent is removed by heating at a temperature in the range of approximately 250° C. to 700° C.

26. The method of claim 25 wherein said heating is in an oxygen-containing atmosphere.

27. The method of claim 22 wherein said reducing includes heating in a hydrogen-containing atmosphere at a temperature in the range of 300° C. to 1100° C.

28. The method of claim 22 wherein said reducing is carried out by heating in an atmosphere containing a hydrogen precursor that upon heating decomposes to form a hydrogen-containing mixture.

29. The method of claim 22 wherein said reducing is carried out in a hydrogen-containing plasma.

30. The method of claim 22 wherein the metal is selectively deposited by chemical vapor deposition.

31. The method of claim 30 wherein the metal selectively deposited is selected from the group consisting of tungsten, molybdenum, copper and aluminum.

32. The method of claim 22 wherein the metallic layer formed by reducing is activated for electroless plating by deposition of a metal selected from Group VIII of the periodic table onto its surface.

33. The method of claim 22 wherein the metal is selectively deposited by electroless plating.

34. The method of claim 33 wherein the metal selectively deposited is selected from the group consisting of nickel, palladium and copper.

35. The method of claim 22 wherein said solution includes water.

36. The method of claim 22 wherein said metallic layer forms a conducting interdiffusion barrier, reducing the rate of interdiffusion positioned above and below the barrier.

37. The method of forming interconnections in microelectronic devices of claim 22 wherein the patterned metallic layer includes separated metallic sites formed on an insulator with said interconnections extending between said separated metallic sites.

38. A method of selectively forming interconnections in a microelectronic device comprising:

spin-coating on a surface of said microelectronic device a radiation sensitive solution containing a polyoxometalate and an organic constituent, the polyoxometalate containing at least one element selected from the group consisting of tungsten, molybdenum, vanadium, niobium, and tantalum to provide a first film;

said polyoxometalate being soluble in water and polar organic solvents and including said one element in a high oxidation state;

lithographically exposing selected regions of said first film;

removing the unexposed portions of said first film to provide a patterned polyoxometalate film;

removing the patterned polyoxometalate film from the unexposed regions of said first film;

substantially removing the organic constituent of said patterned polyoxometalate film to provide a second patterned film reducing said second patterned film to a patterned metallic layer; and selectively depositing a metal on said patterned metallic layer.

39. The method of claim 38 including the additional step of exposing said first film to a solution containing a polyoxometalate in acid prior to removing at least some of said organic constituent to increase the polyoxometalate content of said first film.

40. The method of claim 39 wherein said acid is phosphotungstic acid.

41. The method of claim 38 wherein at least some of said organic constituent is removed by heating at a temperature in the range of approximately 250° C. to 700° C.

42. The method of claim 41 wherein said heating is in an oxygen-containing atmosphere.

43. The method of claim 38 wherein said reducing is carried out by heating in a hydrogen-containing atmosphere at a temperature of approximately 300° C. to 1100° C.

44. The method of claim 38 wherein said reducing is carried out by heating in an atmosphere containing a hydrogen precursor that upon heating decomposes to form a hydrogen-containing mixture.

45. The method of claim 38 wherein said reducing is carried out in a hydrogen-containing plasma.

46. The method of claim 38 wherein the metal which is selectively deposited is deposited by chemical vapor deposition.

47. The method of claim 38 wherein the metal selectively deposited is selected from the group consisting of tungsten, molybdenum, copper and aluminum.

48. The method of claim 38 wherein said patterned metallic layer is activated for electroless deposition of a metal selected from Group VIII of the periodic table.

49. The method of claim 38 wherein the metal is selectively deposited by electroless plating.

50. The method of claim 38 wherein the metal selectively deposited is deposited by electroless plating and is selected from the group consisting of nickel, palladium and copper.

51. The method of claim 38 wherein the solution includes water.

52. The method of claim 38 wherein said patterned metallic layer forms a conducting interdiffusion barrier, reducing the rate of interdiffusion above and below the barrier.

53. The method of forming interconnections in microelectronic devices according to claim 38 wherein said patterned metallic layer includes separated metallic sites formed on an insulator with said interconnections extending between said separated metallic sites.

54. A method of selectively forming interconnections in a microelectronic device comprising:

spin-coating on a surface of said microelectronic device a solution containing a polyoxometalate and an organic constituent, the polyoxometalate containing at least one element selected from the group consisting of tungsten, molybdenum, vanadium, niobium, and tantalum to provide a film;

said polyoxometalate being soluble in water and polar organic solvents and including said one element in a high oxidation state;

substantially removing the organic constituent of said film and simultaneously reducing said film to a metallic film in a hydrogen-containing plasma.

55. The method of forming interconnections in a microelectronic device of claim 59 including the additional steps of:

microlithographically patterning said film prior to removing at least some of said organic constituent of said film; and additionally depositing a metal onto the hydrogen plasma reduced film.

56. The method of forming interconnections in microelectronic devices of claim 54 wherein said microelectronic device includes circuitry at at least two levels that are separated by at least one electrically insulating layer through interconnecting vias extending between sites in circuitry at different levels;

said film being a radiation sensitive resist and covering areas of the surface including the via walls; and selectively depositing an additional metal layer on said metallic film.

57. A method of forming interconnections in microelectronic devices, having circuitry at at least two different levels that are separated by at least one electrically insulating layer through interconnecting vias extending between sites in circuitry at said different levels comprising:

said polyoxometalate being soluble in water and polar organic solvents and including said one element in a high oxidation state;

spin-coating a solution containing a polyoxometalate, the polyoxometalate containing at least one element selected from the group consisting of tungsten, molybdenum, vanadium, niobium, and tantalum to provide a film covering areas including the vias;

reducing said film to a metallic layer.

58. The method of forming interconnections in microelectronic devices of claim 57 including the additional step of depositing an additional metal layer onto said metallic layer.

59. The method of claim 58 wherein the reducing of said film is carried out by heating in a hydrogen-containing atmosphere at a temperature in the range of approximately 300° C. to 1100° C.

60. The method of claim 58 wherein the reducing of said film includes heating in an atmosphere containing a hydrogen precursor that upon heating decomposes to form a hydrogen-containing mixture.

61. The method of claim 58 wherein the reducing of said film is in a hydrogen-containing plasma.

62. The method of claim 58 wherein said solution includes water.

63. The method of claim 58 including the additional step of activating said metallic layer with a metal selected from Group VIII of the periodic table.

64. The method of claim 63 wherein the activating metal is palladium.

65. The method of claim 58 wherein said additional metal layer is provided by a metal selectively deposited by chemical vapor deposition.

66. The method of claim 65 wherein the metal selectively deposited is selected from the group consisting of tungsten, molybdenum, copper and aluminum.

67. The method of claim 58 wherein said additional metal layer is provided by a metal selectively deposited by electroless plating.

68. The method of claim 67 wherein the metal selectively deposited is selected from the group consisting of nickel, palladium, and copper.

69. A method of forming interconnections in a microelectronic device, having circuitry at at least two different levels separated by at least one electrically insulated layer, through interconnecting vias extending between sites in circuitry at said different levels comprising:

spin-coating on a surface of said microelectronic device a solution containing a polyoxometalate and an organic constituent, the polyoxometalate containing at least one element selected from the group consisting of Groups V and VI of the periodic table to provide a film covering areas of the surface including the vias;

removing at least some of said organic constituent of said film;

reducing said film to a first metallic layer; and depositing an additional metal layer on said first metallic layer.

70. The method of claim 69 including the additional step of exposing the film to a solution containing a polyoxometalate in acid prior to removing at least some of the organic constituent to increase the polyoxometalate content of the film.

71. The method of claim 70, wherein said acid is phosphotungstic acid.

72. The method of claim 69 wherein said reducing is carried out by heating in a hydrogen-containing atmosphere at a temperature in the range of approximately 300° C. to 1100° C.

73. The method of claim 69 wherein said reducing is carried out by heating in an atmosphere containing a hydrogen precursor that upon heating decomposes to form a hydrogen-containing mixture.

74. The method of claim 69 wherein said reducing is carried out in a hydrogen-containing plasma.

75. The method of claim 69 wherein said solution includes water.

76. The method of claim 69 including the additional step of activating said metallic layer with a metal selected from Group VIII of the periodic table.

77. The method of claim 76 wherein the activating metal is palladium.

78. The method of claim 69 wherein said additional metal layer is selectively deposited onto said first metallic layer.

79. The method of claim 78 wherein the metal selectively deposited is selected from the group consisting of tungsten, molybdenum, copper, and aluminum.

80. A method of forming interconnections in a microelectronic device, having circuitry at at least two different levels that are separated by at least one electrically insulating layer through interconnecting vias extending between circuitry at said different levels comprising:

spin-coating on exposed surfaces of said microelectronic device and on the walls of said vias a first solution containing a polyoxometalate and an organic constituent, the polyoxometalate containing at least one element selected from the group consisting of tungsten, molybdenum, vanadium, niobium, and tantalum to provide a radiation sensitive resist film covering said exposed surfaces and said via walls;

said polyoxometalate being soluble in water and polar organic solvents and including said one element in a high oxidation state;

lithographically patterning said radiation sensitive resist film to remove selected regions from said exposed surfaces;

substantially removing the organic constituent of the patterned film;

reducing said patterned film to a patterned metallic layer; and selectively depositing an additional metal layer on said patterned metallic layer.

81. The method of claim 80 including the additional step of adding a solution containing a polyoxometalate in acid to said radiation sensitive resist film prior to removing at least some of the organic constituent in order to increase the polyoxometalate content of the film.

82. The method of claim 81 wherein said acid is phosphotungstic acid.

83. The method of claim 81 wherein the organic constituent is substantially removed by heating at a temperature in the range of approximately 250° C. to 700° C.

84. The method of claim 83 wherein said heating is in an oxygen-containing atmosphere.

85. The method of claim 81 wherein said reducing is carried out by heating in a furnace in a hydrogen-containing atmosphere by heating at a temperature in the range of approximately 300° C. to 1100° C.

86. The method of claim 81 wherein said reducing is carried out by heating in a furnace in an atmosphere containing a hydrogen precursor that upon heating decomposes to form a hydrogen-containing mixture.

87. The method of claim 81 wherein said reducing is carried out in a hydrogen-containing plasma.

88. The method of claim 81 wherein said additional metal layer is selectively deposited and includes a metal selected from the group consisting of tungsten, molybdenum, copper, and aluminum.

89. The method of claim 81 wherein said patterned metallic film is activated for electroless plating by deposition onto its surface of an element selected from Group VIII of the periodic table.

90. The method of claim 81 wherein said additional metal layer is selectively deposited by electroless plating and is selected from the group consisting of nickel, palladium and copper.

91. The method of claim 81 wherein said first solution contains water.

92. A method of forming interconnections in a microelectronic device, having circuitry at at least two different levels separated by at least one electrically insulating layer, through interconnecting vias extending between sites in circuitry at said different levels comprising:

spin-coating on surfaces of said microelectronic device a first solution containing a polyoxometalate and an organic constituent, the polyoxometalate containing at least one element selected from the group consisting of tungsten, molybdenum, vanadium, niobium, and tantalum to provide a radiation sensitive resist film covering said surfaces and said vias;

lithographically patterning said radiation sensitive film to remove selected regions thereof and provide a lithographically patterned film;

removing the polyoxometalate from the regions not covered by said lithographically patterned film to provide a patterned polyoxometalate film covering areas of said microelectronic device including said vias;

removing said lithographically patterned film;

removing the unprotected areas of said patterned polyoxometalate film to provide a modified polyoxometalate film;

substantially removing the organic constituent of said modified polyoxometalate film;

reducing said modified polyoxometalate film to provide a patterned metallic layer; and selectively depositing an additional metal layer on said patterned metallic layer.

93. The method of claim 92 including the additional step of exposing the film to a solution containing a polyoxometalate in acid prior to removing at least some of the organic constituent to increase the polyoxometalate content of the film.

94. The method of claim 93 wherein said first solution contains phosphotungstic acid.

95. The method of claim 92 wherein the organic constituent is substantially removed by heating at a temperature in the range of approximately 250° C. to 700° C.

96. The method of claim 95 wherein said heating is in an oxygen-containing atmosphere.

97. The method of claim 92 wherein said reducing is carried out by heating in a furnace in a hydrogen-containing atmosphere at a temperature in the range of approximately 300° C. to 1100° C.

98. The method of claim 92 wherein said reducing is carried out by heating in a furnace in an atmosphere containing a hydrogen precursor that upon heating decomposes to form a hydrogen-containing mixture.

99. The method of claim 92 wherein said reducing is carried out in a hydrogen-containing plasma.

100. The method of claim 92 wherein said additional metal layer is selected from the group consisting of tungsten, molybdenum, copper and aluminum.

101. The method of claim 92 wherein said patterned metallic layer is activated for electroless plating by deposition of palladium onto its surface.

102. The method of claim 92 wherein said additional metal layer which is selectively deposited onto said patterned metallic layer is selected from the group consisting of nickel, palladium and copper.

103. The method of claim 92 wherein said first solution contains water.

104. A method of forming interconnections in a microelectronic device, having circuitry at at least two different levels separated by at least one electronically insulating layer, through interconnecting vias extending between sites in circuitry at different levels comprising:

spin-coating on said microelectronic device a solution containing a polyoxometalate and an organic constituent, the polyoxometalate containing at least one element selected from the group consisting of tungsten, molybdenum, vanadium, niobium, and tantalum to provide a first film covering said levels of said microelectronic device and the vias;

spin-coating on said first film a radiation sensitive resist film;

said polyoxometalate being soluble in water and polar organic solvents and including said one element in a high oxidation state;

lithographically exposing selected regions of said radiation sensitive resist film on said surfaces of said levels to remove selected regions to provide a lithographically patterned film;

removing the unexposed portions of said radiation sensitive film on said surfaces of said levels to provide a patterned polyoxometalate film covering said selected surfaces and said vias;

substantially removing the organic constituent of the unexposed portion of said radiation sensitive film on said surfaces and said vias to provide a modified patterned film;

reducing said modified patterned film to provide a patterned metallic layer; and selectively depositing an additional metal layer on the patterned metallic layer.

105. The method of claim 104 including the additional step of exposing said radiation sensitive film to a solution containing a polyoxometalate in acid prior to removing at least some of the organic constituent to increase the polyoxometalate content of the film.

106. The method of claim 105 wherein said solution contains phosphotungstic acid.

107. A method of forming interconnections in a microelectronic device, having circuitry at at least two levels separated by at least one electrically insulating layer, through interconnecting vias extending between sites in circuitry at said different levels comprising:

spin-coating a solution containing a polyoxometalate, the polyoxometalate containing at least one element selected from the group consisting of tungsten, molybdenum, vanadium, niobium, and tantalum to provide a film covering the surface areas of said levels and said vias;

reducing said film to a metallic layer;

substantially removing the metallic layer from said surfaces of said microelectronic device by anisotropic back etching; and selectively depositing an additional metal layer on the residual metallic layer in said vias.

108. The method of claim 107 wherein said reducing is carried out by heating in a hydrogen-containing atmosphere at a temperature in the approximate range of 300° C. to 1100° C.

109. The method of claim 107 wherein said reducing is carried out by heating in an atmosphere containing a hydrogen precursor that upon heating decomposes to form a hydrogen-containing mixture.

110. The method of claim 107 wherein said reducing is carried out in a hydrogen-containing plasma.

111. The method of claim 107 wherein the metal which is selectively deposited is deposited by chemical vapor deposition and is selected from the group consisting of tungsten, molybdenum, copper and aluminum.

112. The method of claim 107 wherein the metallic film formed by reducing is activated for electroless plating by deposition of a metal selected from Group VIII of the periodic table.

113. The method of claim 107 wherein the additional metal layer which is selectively deposited is deposited by electroless plating.

114. The method of claim 113 wherein the metal selectively deposited by electroless plating is selected from the group consisting of nickel, palladium and copper.

115. The method of claim 107 wherein said solution contains water.

116. A method of forming interconnections in a microelectronic device, having circuitry at at least two different levels separated by at least one electrically insulating layer, through metallized interconnecting vias extending substantially perpendicular between sites in circuitry at said different level comprising:

spin-coating a first solution containing a polyoxometalate and an organic constituent, the polyoxometalate containing at least one element selected from the group consisting of tungsten, molybdenum, vanadium, niobium, and tantalum to provide a film covering areas including the vias;

substantially removing the organic constituent of the film;

reducing said film to a first metallic layer;

removing said film from selected areas of said levels by anisotropic back etching; and selectively depositing an additional metal layer on said first metallic layer.

117. The method of claim 116 including the additional step of exposing the film to a second solution containing a polyoxometalate in acid prior to removing at least some of the organic constituent to increase the polyoxometalate content of the film.

118. The method of claim 117 wherein said second solution contains phosphotungstic acid.

119. The method of claim 116 wherein the organic constituent is removed by heating at a temperature in the range of 250° C. to 700° C.

120. The method of claim 119 wherein said heating is in an oxygen-containing atmosphere.

121. The method of claim 116 wherein said reducing is carried out by heating in a hydrogen-containing atmosphere at a temperature in the range of 300° to 1100° C.

122. The method of claim 116 wherein said reducing is carried out by heating in an atmosphere containing a hydrogen precursor which upon heating decomposes to form a hydrogen-containing mixture.

123. The method of claim 116 wherein said reducing is carried out in a hydrogen-containing plasma.

124. The method of claim 116 wherein the additional metal layer which is selectively deposited is deposited by chemical vapor deposition.

125. The method of claim 124 wherein the additional metal layer includes a metal selected from the group consisting of tungsten, molybdenum, copper and aluminum.

126. The method of claim 116 wherein the first metallic film is activated for electroless plating by deposition thereon of an element selected from Group VIII of the periodic table.

127. The method of claim 116 wherein the additional metal layer is selectively deposited onto the first metallic layer by electroless plating.

128. The method of claim 127 wherein said additional metal layer includes a metal selected from the group consisting of nickel, palladium and copper.

129. The method of claim 116 wherein said first solution contains water.

* * * * *